United States Patent [19]

Yamanaka

[11] Patent Number: 4,678,889
[45] Date of Patent: Jul. 7, 1987

[54] METHOD OF LASER TRIMMING IN SEMICONDUCTOR WAFER

[75] Inventor: Hiroshi Yamanaka, Tokyo, Japan

[73] Assignee: NEC Corporation, Tokyo, Japan

[21] Appl. No.: 795,609

[22] Filed: Nov. 6, 1985

[30] Foreign Application Priority Data

Nov. 6, 1984 [JP] Japan .................. 59-233805

[51] Int. Cl.$^4$ ............................. B23K 26/00
[52] U.S. Cl. .................. 219/121 LJ; 219/121 LQ; 219/121 LY
[58] Field of Search .................. 219/121 LJ, 121 LN, 219/121 LY, 121 LG, 121 LN, 121 L, 121 LM, 121 LQ, 121 LR, 121 LE, 121 LF

[56] References Cited

U.S. PATENT DOCUMENTS 3,584,183 6/1971 Chiaretta et al. .......... 219/121 LJ X
4,240,094 12/1980 Mader ..................... 219/121 LM X

*Primary Examiner*—C. L. Albritton
*Attorney, Agent, or Firm*—Sughrue, Mion, Zinn, Macpeak, and Seas

[57] ABSTRACT

A method of laser trimming in a semiconductor wafer, and more particularly, a method of laser trimming for disconnecting programmable links by use of a laser beam which links are provided within a multiplicity of semiconductor integrated circuit elements formed in the semiconductor wafer.

3 Claims, 12 Drawing Figures

METHOD OF LASER TRIMMING IN SEMICONDUCTOR WAFER

FIELD OF INDUSTRIAL UTILIZATION

The present invention relates to a method of laser trimming in a semiconductor wafer, and more particularly, to a method of a laser trimming for disconnecting programmable links by use of a laser beam which links are provided within a multiplicity of semiconductor integrated circuit elements formed in the semiconductor wafer.

PRIOR ART

Recently, semiconductor memory elements having large capacity such as a 64 K DRAM, a 256 K DRAM or the like have been developed. These devices are equipped with circuits which include redundant bits to produce with high yield. The technique is that if the original bits prove to be defective at the stage of a wafer, a prepared programmable link is fusibly disconnected by a laser beam for the purpose of utilizing the redundant bits. Information on this technique has been disclosed, for example, by ROBERT T. SMITH and others on pages 506 to 514 of "IEEE JOURNAL OF SOLID-STATE CIRCUITS", Vol. SC-16, No. 5, October, 1981.

On the other hand, in a linear IC device, some resistors into which a plurality of thin film resistances and a plurality of programmable links are combined are formed in a semiconductor integrated circuit element. Predetermined links are subjected to a laser beam cutting operation with a view to making a resistance value of this resistor equal to a predetermined value.

Thus, the laser beam is broadly utilized for disconnecting the above-described link portions within the semiconductor wafer.

With a conventional method, however, the semiconductor wafer is initially mounted on an X-Y stage, and a single semiconductor integrated circuit element (semiconductor chip) is so disposed as to be irradiated with the laser beam while being transferred intermittently. Where the place is confirmed by making use of an alignment pattern provided on each of the semiconductor chips. So far as this step is concerned, an He-Ne laser, for instance, whose beam is weaker than the laser beam for cutting off a link, can be used. On the basis of data obtained by previously measuring the properties of the foregoing semiconductor chip, for instance, a YAG laser is irradiated to a predetermined portion thereby to disconnect the link formed therein. In the prior art technique, the irradiation of a laser beam is performed within a single semiconductor chip in accordance with the motion of a mirror provided above the semiconductor chip. Namely, the semiconductor chips are respectively transferred in an intermittent manner by means of the X-Y stage under the semiconductor wafer and are fixed at a position under the irradiation of the laser beam. Then, the forementioned mirror varies its angle, or another X-Y stage associated with the mirror is moved. Owing to this arrangement, the predetermined spot set within the semiconductor chip is irradiated with the laser beam, thus cutting off the link formed therein. However, according to the method of this kind the laser beam becomes unstable, since the passage changes in the single semiconductor chip. To exemplify, there is created a deviation of about 1 to 2% in laser power between the shortest distance and the longest distance of the optical length. Therefore, trimming conditions, viz., link disconnecting conditions vary between the central portion of the semiconductor chip and the peripheral portion thereof. Further, a mechanical structure is additionally necessary in either case of means for moving the mirror being a device which changes the angle or a device which employs an X-Y stage. Therefore the irradiation spot on the semiconductor chip creates an error of ±1.0 μm. Moreover, the foregoing mirror moving mechanism is apt to bring about troubles and further undergoes oft-required adjustments and maintenances. This, as a result, contributes to a decrease of approximately 10% in operation rate.

DETAILED DESCRIPTION OF THE INVENTION

Figure 5:
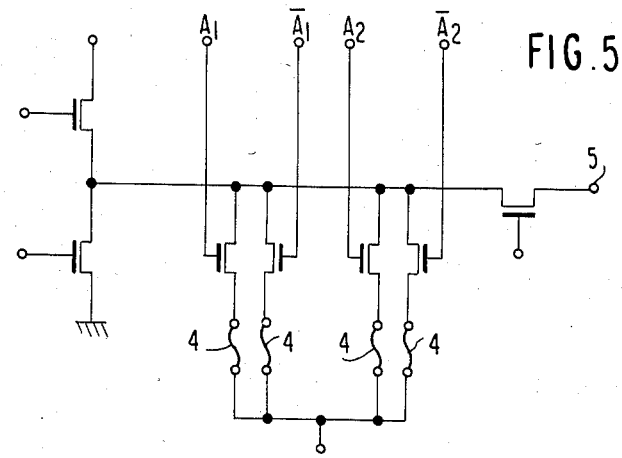
FIG. 5 is a circuit diagram illustrating a part of a decoder set in a memory device to which the present invention is applied.
Figure 6A:
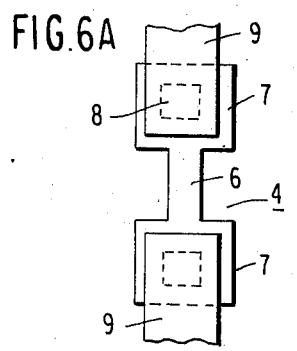
FIG. 6 is a plan view of a fuse to which the present invention is applied.

FIG. 5 shows a part of a decoder to which redundant bit columns or redundant bit rows are connected, these columns or rows being provided in a semiconductor storage element possessing large capacity to which element the present invention can be applied. Among a plurality of programmable links 4 provided in the decoder circuit, a selectively determined fuse is disconnected for the sake of changing over memory cells having a defective bit according to the column or row. In the Figure, an output terminal 5 is connected, for example, to a word line of the memory cell. This link, as can be observed through a plan view of FIG. 6A, takes a planar configuration. Namely, an elongated portion having a width of about 3 μm, a length of 10 μm, in a polycrystalline silicon layer having a thickness of 0.5 μm is used as a link cut-off part 6, and a square contact portion 7 of 5×5 μm□ is formed at both ends thereof. An aluminum wire 9 is connected via a contact opening 8 formed in an insulating film (not shown) to the contact portion. As can be seen through FIG. 6B, a link selected for disconnection among the links 4 shown in FIG. 5 is subjected to the irradiation of a laser beam thereby to cut off a disconnecting section 10 which is approximately 5 μm long. The redundant bit lines of 40 to 160 numbers are prepared in a row-direction and a column-direction within a single semiconductor storage element, and therefore, the same number of decoder circuits illustrated in FIG. 5 are prepared. A half of total decoder circuits undergo the forementioned laser trimming, which situation depends on the yield thereof, though.

Figure 6B:
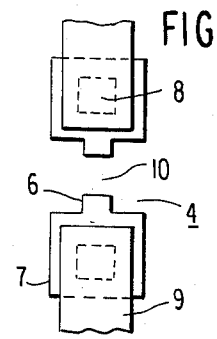
Figure 7:
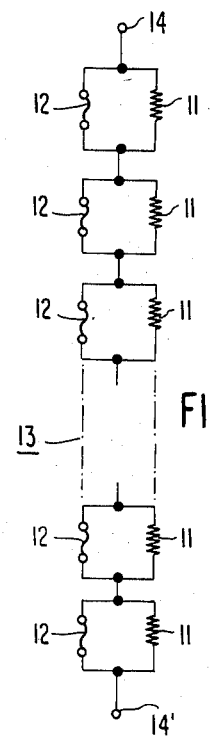
FIG. 7 is a circuit diagram of a resistor to which the present invention is applied.

On the other hand, a resistor 13 is, as shown in FIG. 7, constituted by a plurality of thin film resistances 11 and programmable links 12 in an IC linear integrated circuit element or the like. The predetermined links are disconnected by the laser beam, whereby a resistance value of the resistor 13 is so set as to be equal to a predetermined resistance value between terminals 14, 14'. The thin film resistance 11 may be formed of chromium or the like. The link 12 assumes a planar configuration as in the case of the link shown in FIG. 6A. It is necessary to prepare about ten links 12 for a single resistor 13. Accordingly, the thin film resistance serving as the unit resistance 11 needs some ten pieces for preparation, and they are connected with respect to each other as shown in FIG. 7; and three or four links 12 thereof are disconnected as illustrated in FIG. 6B.

A material of the link shown in FIG. 6 is herein exemplified by polycrystalline silicon. It is, however, possible to employ refractory metals (Refractory metal) such as molybdenum, tungsten or the like and further utilize an alloy (silicide) of these metals and polycrystalline silicon.

Figure 8:
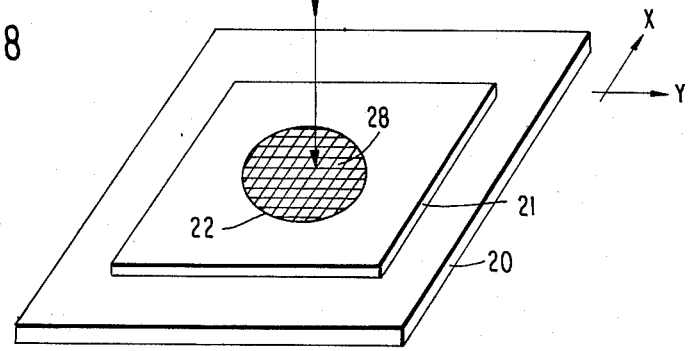
FIG. 8 is a view showing an apparatus employing a prior art technique.
Figure 9:
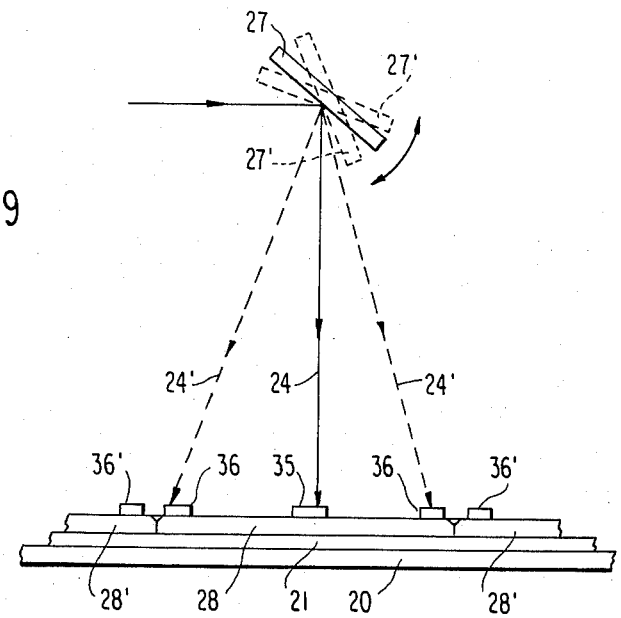
FIGS. 9 AND 10 are expanded views each showing the conventional method.

FIG. 8 is a schematic view illustrating a prior art technique, where a wafer board 21 is placed on an X-Y stage 20 and a semiconductor wafer 22 is disposed thereon. On the other hand, a laser beam 24 emitted from a laser light source 23, for instance, a YAG laser light source, passes through an optical system 26 including a shutter 25 and is refracted downwards at an angle of approximately 90° by a mirror 27. Inasmuch as the X-Y stage moves its planar surface in directions X and Y, the semiconductor wafer 22 is both horizontally and intermittently transferred in the directions X and Y by the X-Y stage 20; and a single semiconductor chip 28 is placed under the laser beam irradiated downward. The semiconductor chip 28 has a multiplicity of the foregoing programmable links 4, 12 provided therein, as shown in FIGS. 5, 6 and 7. Some links predetermined on the basis of the data obtained by previously measuring the properties of the semiconductor chip 28 are disconnected by use of the laser beam. Further, an alignment mark (not shown) is formed in each semiconductor chip 28; the position of every semiconductor chip is confirmed by a weak laser like a He-Ne laser, and the thus obtained information is transmitted to a driving mechanism of the mirror 27. After the required links within the single semiconductor chip 28 have completely been disconnected on the basis of the thus conveyed information, the next semiconductor chip adjacent thereto is placed beneath the laser beam by carrying out the intermittent transferring operation by the X-Y stage 20. The prior art technique involves a step in which the semiconductor chip, viz., a semiconductor wafer, is made stationary—the X-Y stage 20 is rendered unmovable—and the mirror 27 is made to rotate in a direction indicated by an arrow 30, or the mirror 27 is arranged to be connected to another X-Y stage in order that this stage is horizontally moved within the semiconductor chip in a direction pointed by an arrow 31, thereby leading to a step of disconnecting the link thereof. Such being the case, a mechanism by which to drive the mirror 27 is indispensable for the conventional technique. Referring to FIG. 9, it can be observed that the mirror 27 is rotationally shifted from 27 to 27' in the direction pointed by the arrow 30 by the rotary mechanism (not shown). With this arrangement, the laser beam is shifted from a position 24 to 24'; when the mirror 27 makes an angle of 45°, that is, positioned at the numeral 27, the laser beam 24 is capable of cutting off a programmable link 35 (which is one of the links 4, 12 shown in FIGS. 5 to 7 located at the center of the semiconductor chip 28. On the other hand, by rotating the mirror as the numeral 27', the laser beam 24' is slanthy irradiated, and it is able to disconnect peripheral links 36 (4, 12). From this drawing, the optical length of the laser beam 24 is apparently different from that of the laser beam 24', and therefore, the laser powers irradiated on the semiconductor chip are different each other.

Figure 10:
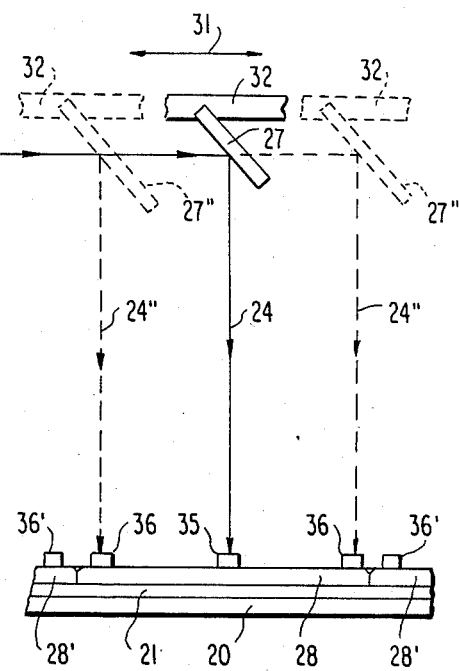

FIG. 10 shows another example of the prior art technique. The mirror 27 is fixed to an X-Y stage 32 and then moves in the direction indicated by the arrow 31. If the mirror 27 be situated at the position 27, it is feasible to disconnect the centrally disposed programmable links 35 by the laser beam 24, whereas if the mirror shifts to a position 27", the peripheral links 36 can be disconnected by a laser beam 24". It is to be noted that the numeral 28' represents an adjacent semiconductor chip and the numeral 36' stands for peripheral link in FIGS. 9, 10. As a mater of course, the mechanism by which to actuate the mirror 27 receives the forementioned positioning signal and a signal of the data obtained by previously measuring the properties of the semiconductor chip; and a signal based on the measurement data is transmitted to the foregoing shutter 25 as well. The shutter 25 closes and uncloses on quickly responding to the motion of the mirror 27, thus carrying off the required links. In any case, there is produced an error of ±1.0 μm relative to the irradiation spot thereof; and the driving mechanism of the mirror 27 is declined in its operation rate on account of the fact that the mirror is always made to move.

PROBLEM TO BE SOLVED BY THE INVENTION

It is an object of the present invention to provide a method of laser trimming in a semiconductor wafer; by the method the power of the laser beam irradiated on all portions in the semiconductor chip can be maintained in constant, and the laser beam can be irradiated on the predetermined portions. Further, the method can enhance the operation rate.

MEANS FOR SOLVING THE PROBLEM

In relation to a method of laser trimming in a semiconductor wafer according to the present invention, the laser beam applied to the semiconductor wafer, that is, the laser beam irradiated on the semiconductor chips is made stationary, the laser beam per se being so arranged as to be applied to the semiconductor wafer constantly at, for instance, a right angle thereto and further being so arranged as not to move to and fro or leftwards and rightwards with respect to the semiconductor chip. To be more precise, the present invention comprises steps wherein the laser beam from the laser source is irradiated on the semiconductor wafer through the intermediaries of an optical system including a shutter, and a mirror, wherein when disconnecting selectively determined links among a plurality of programmable links formed on the semiconductor chips of the semiconductor wafer is rendered, the mirror is fixed always and the X-Y stage on which the semiconductor wafer is mounted is transferred intermittently and minutely; due to the minute operation of the X-Y stage, it is practicable to locate the predetermined link in one semiconductor chip under the fixed laser beam, and wherein the above-described shutter is made to open thereby to disconnect the fuse thereof. The properties of the entire semiconductor chips provided in the semiconductor wafer are previously measured and stored for the purpose of controlling the X-Y stage. Consequently, the X-Y stage, on which the semiconductor wafer is mounted, is intermittently transferred in order that the single semiconductor chip is positioned under the laser beam, and thereafter, the X-Y stage is minutely moved, this leading to the disconnection of the necessary links in the semiconductor chip. Another method can be adopted as follows. Without carrying out any intermittent transferring operation, the required links provided at the central portions of a plurality of semiconductor chips are firstly cut off. In the second place, the necessary links provided at the peripheral portions of a plurality of semiconductor chips may be disconnected. In either case, the X-Y stage is stopped its movement for a time of 0.01 sec. needed for disconnecting a link by the laser beam. Moreover, the X-Y stage in the present invention can be used that of an electron beam light exposure apparatus and also a smaller scaled projection light exposure apparatus. It is possible to perform the laser beam disconnection with positioning accuracy of $\pm 0.1$ $\mu$m, if the mentioned above stage is equipped with a length measuring means which employs a laser interference measuring meter and being set on a vibration-proof board. In such a case, there is needed no alignment operation for every semiconductor chip; and it is sufficient that an objective spot is confirmed by means of the He-Ne laser in accordance with a wafer alignment mark in the semiconductor wafer. The resultant information is, as matter of course, conveyed to the X-Y stage.

Description relative to the laser trimming method of disconnecting predetermined programmable links has so far been made. However, the laser trimming method according to the present invention is not confined to only the disconnection of a fuse. It can be applied following cases wherein undesirable wiring layers are cut off by the laser beam, or a part of a thin film resistance is notched by making use of the laser beam thereby to adjust resistance values of a resistor.

THE PREFERRED EMBODIMENTS

Figure 1A:
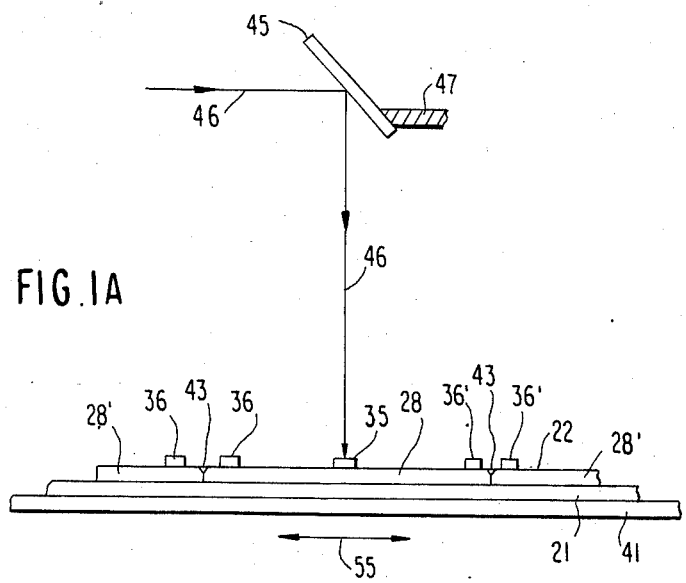
FIG. 1 is an enlarged view showing one embodiment according to the present invention.
Figure 1B:
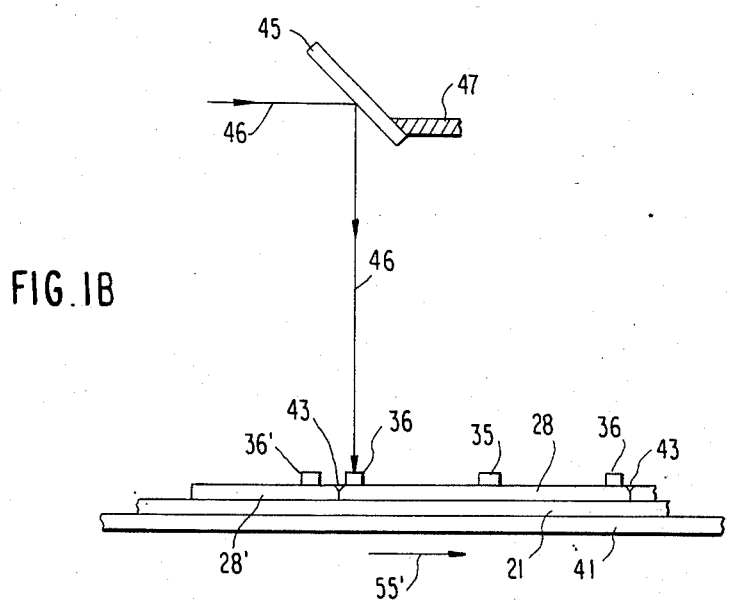
Figure 2:
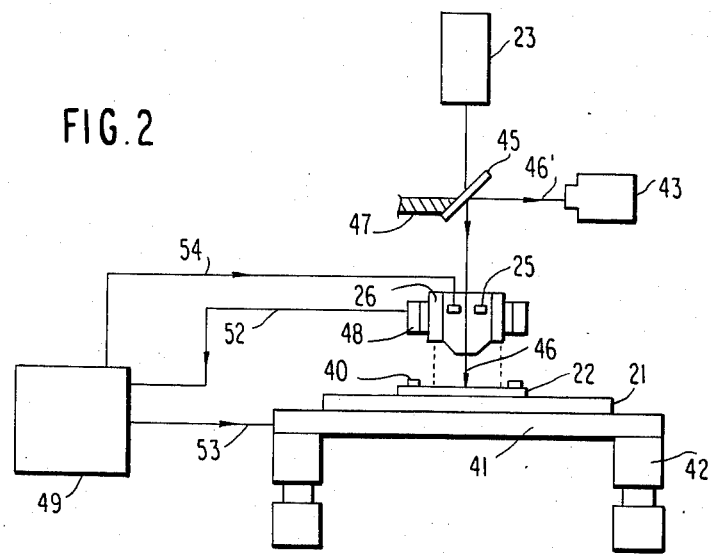
FIG. 2 is a view showing an apparatus employed for the embodiment according to the present invention.
Figure 3:
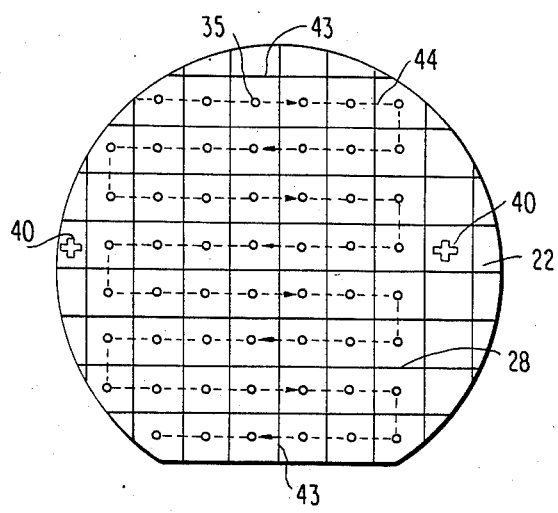
FIG. 3 is a plan view of a semiconductor wafer employed for one embodiment of the present invention.

FIGS. 1 to 3 show a first embodiment of the present invention. Components that have the same function as those described in other drawings are indicated by the same numerals. Referring to FIG. 3, a multiplicity of semiconductor pellets 28 sectioned by scribe regions 43 are formed in a semiconductor wafer 22. Each of the semiconductor pellets 28 is provided with a plurality of programmable links 35. Some selected links are disconnected by the laser beam for every semiconductor pellet. A reference numeral 44 shows an order of an intermittent transferring process. The semiconductor wafer having the programmable links shown in FIGS. 5 to 7 is disposed through the medium of a wafer board 21 on an X-Y stage 41. This X-Y stage 41 which is set on a vibration-proof board 42 can move precisely as an X-Y stage of an electron beam light exposure apparatus. Next, by virtue of an alignment device 48 employing a weak laser beam such as He-Ne laser, the position of the semiconductor wafer is made sure by a step wherein the weak laser beam is applied to a wafer alignment mark 40 thereof; and a resultant signal 52 is transmitted to a control unit 49. This control unit 49 includes data previously stored therein which contribute to determining which to disconnect with respect to the links of the respective semiconductor chips, such data being obtained by measuring each of the semiconductor chips in the semiconductor wafer. On the other hand, a YAG laser beam 46 by which to disconnect the links is emitted from a laser light source 23 and is then applied at an almost right angle to the semiconductor wafer via a mirror 45 (half-reflection mirror in this embodiment), a shutter 25 and an optical system 26 inclusive of a condensing lens. The mirror 45 is fixed by a fixing member 47 in order not to deviate therefrom. Namely, it does not make a relative motion to unmovable devices such as laser light source or the like. In this embodiment, there is shown a half reflection mirror. However, the overall reflection mirror illustrated in FIG. 1 mentioned later may also be employed. A reference numeral 43 denotes a monitor television for monitoring the irradiation of the laser beam 46'. So far as the present invention is concerned, the axis of a laser beam 46 that is applied to the semiconductor wafer is by no means movable. A control signal issued by the control unit 49 is transmitted to the X-Y stage and the shutter 25 on the basis of the signal of the forementioned alignment light exposure and the measurement data regarding each of the foregoing semiconductor chips. The X-Y stage 41 is intermittently transferred for every semiconductor chip in accordance with the thus transmitted control signal. After the intermittent transferring operation has been completed, the X-Y stage is then minutely transferred in such a manner that the programmable link is placed beneath the undeviating laser beam, this link being fusibly disconnective on the single semiconductor chip. In the wake of this, the X-Y stage stops to open the shutter, thereby disconnecting the link. All the links to be cut off are thus disconnected on the single semiconductor chip. In the second place, the forementioned intermittent transferring operation is conducted with a view to disconnecting the required links of the next semiconductor chip. This situation is now described with reference to FIG. 1. FIG. 1 is depicted to facilitate a comparison with FIGS. 9, 10 showing prior art techniques. Accordingly, the mirror identical with that shown in FIGS. 9, 10 is herein employed, the arrangement being such that between the mirror and the semiconductor wafer, there is provided no optical system. In FIG. 1, as explained before, the laser beam 46 is so applied to the semiconductor wafer as not to axially deviate therefrom. Namely, in FIG. 1A, the links 35 provided at the central portion of the semiconductor chip 28 be defined as the one to be cut off, this link 35 is disconnected; and then the X-Y stage 41 is arranged to move in the directions X, Y as indicated by an arrowhead 55 in order that the necessary spots to be irradiated within the semiconductor chip are situated beneath the axis of the laser beam. In case where the foregoing X-Y stage for an electron beam light exposure is adopted, it is possible to perform the positioning operation with accuracy of $\pm 0.1$ $\mu$m. As shown in FIG. 1B, for example, if the X-Y stage be moved in a direction pointed by an arrowhead 55', the peripheral links 36 can be positioned under the stationary axis of the laser beam. Where the link proves to be an object for disconnection, the shutter is opened after this link has been placed at the predetermined spot, thus disconnecting the link. The laser power for disconnecting a link is as strong as about 0.2–10 $\mu$m joul, although it depends on material-quality and configuration of the link. The time required for cutting off a link is some 0.01 sec. The YAG lasser is employed in this embodiment, however, other lasers may be utilized. When previously measuring a plurality of semiconductor chips within the semiconductor wafer, an ordinary prober is used; and the thus measured data is sent via a station to a tester. This memory may be put into a floppy disk and be set in the above-described control unit.

Figure 4:
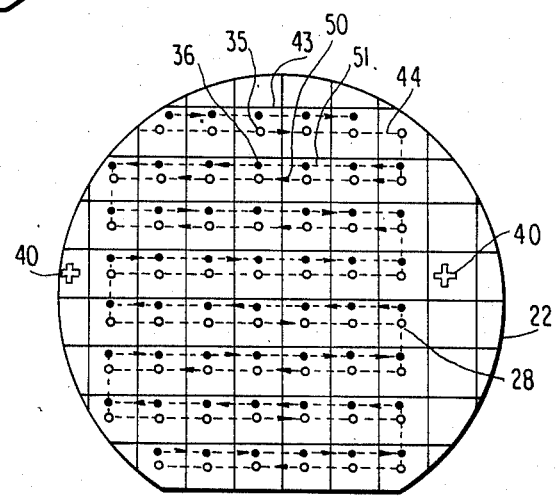
FIG. 4 is a plan view of a semiconductor wafer designed for another embodiment of the present invention.

FIG. 4 shows another embodiment according to the present invention. Components which have the same functions as those shown in other drawings are marked by the same numerals. The previous embodiment involves the following steps: the X-Y stage is intermittently conveyed for every semiconductor chip and is then minutely transferred such that the link within the single semiconductor chip is disposed beneath the undeviating axis of the laser beam; and, after the necessary disconnecting process by the laser has been finished, the X-Y stage resumes its intermittent transferring operation in order to feed out the next semiconductor chip thereto. In this embodiment, however, this method is unadoptable. For instance, the links 35 (marked by •) at the central portions of a plurality of semiconductor chips are substantially placed under the axis of the laser beam by adjusting the movement of the X-Y stage. Just when the link 35 to be disconnected is situated at the irradiation spot, the X-Y stage is temporarily made to halt. Thereupon, the shutter is opened thereby to disconnect the link 35. At this time, an arrow 50 indicates a relative motion when viewed from the semiconductor wafer. Next, the X-Y stage is so moved that an arrow 51 similarly denotes the relative motion when viewed therefrom; and the same stage is arranged such that the peripheral links 36 (marked by •) of a plurality of semiconductor chips are placed beneath the axis of the laser beam. When the link 36 to be cut off comes to the irradiation spot, the X-Y stage is temporarily made to stop. Thereupon, the shutter is opened, whereby the link 36 is disconnected. A method of this kind is effective in the trimming not only for every single link but also for every block. In an X-decoder, the links of the respective semiconductor memory chips which links require redundant bits are disconnected. Thereafter, the links of the respective semiconductor memory chips which links need redundant bits are cut off in a Y-decoder. This method is helpful to accelerate the trimming operation as regards the whole semiconductor wafer, but it depends on the lay-out of the links in the semiconductor chip.

EFFECT OF THE INVENTION

According to the present invention, the trimming operation can be performed with stability and high productivity.

I claim:

1. A method of laser trimming in a semiconductor wafer by a laser trimming apparatus, said semiconductor wafer having a plurality of semiconductor pellets, each said semiconductor pellet including a first programmable link positioned at a first position thereof and a second programmable link positioned at a second portion apart from said first portion, said laser trimming apparatus having an X-Y stage which is movable horizontally in X and Y directions and a laser beam means provided above said X-Y stage for irradiating a laser beam downward at predetermined periods along a fixed axis which is kept invariable, said method comprising the steps of:

mounting said semiconductor wafer on said X-Y stage, conducting a first series of trimming operations, said first series of operations including moving said X-Y stage such that said first programmable links of said semiconductor pellets successively intersect said fixed axis, stopping said X-Y stage for a first duration of time whenever such one of the first programmable links that is to be disconnected is positioned under said fixed axis, and irradiating said laser beam along said fixed axis during said first duration of time in order to disconnect the first programmable link, and conducting a second series of trimming operations after the first programmable links that are to be disconnected are all disconnected by said first series of operations, said second series of operations including moving said X-Y stage such that said second programmable links of said semiconductor pellets successively intersect said fixed axis, stopping said X-Y stage for a second duration of time whenever such one of the second programmable links that is to be disconnected is positioned under said fixed axis, and irradiating said laser beam along said fixed axis during said second duration of time in order to disconnect the second programmable link to be disconnected.

2. A method of claim 1, in which said semiconductor pellet is a semiconductor memory pellet, and said first and second programmable links constitute an X-decoder and a Y-decoder, respectively.

3. A method of claim 1, in which said first and second programmable links are made of polycrystalline silicon.

* * * * *